(12) United States Patent
Sahu et al.

(10) Patent No.: US 9,111,637 B1
(45) Date of Patent: Aug. 18, 2015

(54) DIFFERENTIAL LATCH WORD LINE ASSIST FOR SRAM

(71) Applicant: LSI Corporation, San Jose, CA (US)

(72) Inventors: Rahul Sahu, Bangalore (IN); Rajiv Kumar Roy, Bangalore (IN); Rasoju Veerabadra Chary, Bangalore (IN); Dharmendra Kumar Rai, Uttar Pradesh (IN)

(73) Assignee: Avago Technologies General IP (Singapore) Pte Ltd, Singapore (SG)

( * ) Notice: Subject to any disclaimer, the term of this patent is extended or adjusted under 35 U.S.C. 154(b) by 0 days.

(21) Appl. No.: 14/274,965

(22) Filed: May 12, 2014

(51) Int. Cl.
    *G11C 11/00* (2006.01)
    *G11C 11/417* (2006.01)
    *G11C 5/06* (2006.01)

(52) U.S. Cl.
    CPC ............. *G11C 11/417* (2013.01); *G11C 5/06* (2013.01)

(58) Field of Classification Search
    USPC ............................. 365/154, 155, 156, 230.06
    See application file for complete search history.

(56) References Cited

U.S. PATENT DOCUMENTS

| | | | |
|---|---|---|---|
| 6,252,820 B1 * | 6/2001 | Nakamura | 365/233.1 |
| 6,556,471 B2 * | 4/2003 | Chappell et al. | 365/154 |
| 7,289,354 B2 | 10/2007 | Houston | |
| 7,733,711 B2 * | 6/2010 | Burnett et al. | 365/189.09 |
| 7,852,700 B2 * | 12/2010 | Akiyoshi | 365/227 |
| 8,004,907 B2 | 8/2011 | Russell et al. | |
| 8,427,896 B1 | 4/2013 | Agarwal et al. | |

* cited by examiner

*Primary Examiner* — Pho M Luu
(74) *Attorney, Agent, or Firm* — Duft Bornsen & Fettig LLP

(57) ABSTRACT

Word line assist circuits are disclosed for high performance sub-micron SRAM designs. One embodiment is an SRAM device that includes a memory cell array and a pair of word lines that traverse the memory cell array for selecting memory cells. The SRAM device further includes a pair of word line drivers, each coupled to one of the word lines. The SRAM device further includes a word line assist circuit coupled to the pair of word lines that receives an enable signal. Responsive to receiving the enable signal, the word line assist circuit assists the first word line driver and the second word line driver in transitioning their respective word lines from a logic level zero to a logic level one in response to a voltage differential between the word lines.

20 Claims, 4 Drawing Sheets

DIFFERENTIAL LATCH WORD LINE ASSIST FOR SRAM

FIELD OF THE INVENTION

The invention generally relates to field of word line assist circuits for memory devices.

BACKGROUND

In wide Static Random Access Memory (SRAM) devices, the number of columns of memory cells can be very high. When a word line traverses across the high number of memory cells, the word line is subjected to a large amount of impedance (e.g., from the gate capacitances of the SRAM latch access transistors). In small process technologies (e.g., 16 nanometer), it is difficult to ensure that the ends of the word lines that are farthest away from the word line drivers achieve an acceptable slope. In some cases, the far ends of the word lines are unable to reach the supply rail voltage of the drivers, which reduces the noise margin for memory cells located at the far ends. While word lines can often include re-buffers to boost the word line signals (e.g., a series pair of inverters in a word line signaling path), the re-buffers introduce propagation delays, which decreases the performance of the SRAM devices.

SUMMARY

Word line assist circuits are disclosed for high performance sub-micron SRAM designs. One embodiment is an SRAM device that includes a memory cell array and a pair of word lines. The word lines traverse the memory cell array for selecting memory cells of the memory cell array. Each of the word lines has a first end and a second end. The SRAM device further includes a pair of word line drivers that are coupled to the first end of the word lines. A first of the word line drivers is operable to toggle a first of the word lines between logic levels defined by a memory cell supply for the memory cells. A second of the word line drivers is operable to toggle a second of the word lines between the logic levels. The SRAM device further includes a word line assist circuit that is coupled to the pair of word lines and is operable to receive an enable signal. Responsive to receiving the enable signal, the word line assist circuit is further operable to assist the first word line driver in transitioning the first word line from a logic level zero to a logic level one in response to a positive voltage differential between the first word line and the second word line. The word line assist circuit is further operable to, responsive to receiving the enable signal, assist the second word line driver in transitioning the second word line from a logic level zero to a logic level one responsive to a positive voltage differential between the second word line and the first word line.

The various embodiments disclosed herein may be implemented in a variety of ways as a matter of design choice. For example, some embodiments herein are implemented in hardware whereas other embodiments may include processes that are operable to construct and/or operate the hardware. Other exemplary embodiments are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
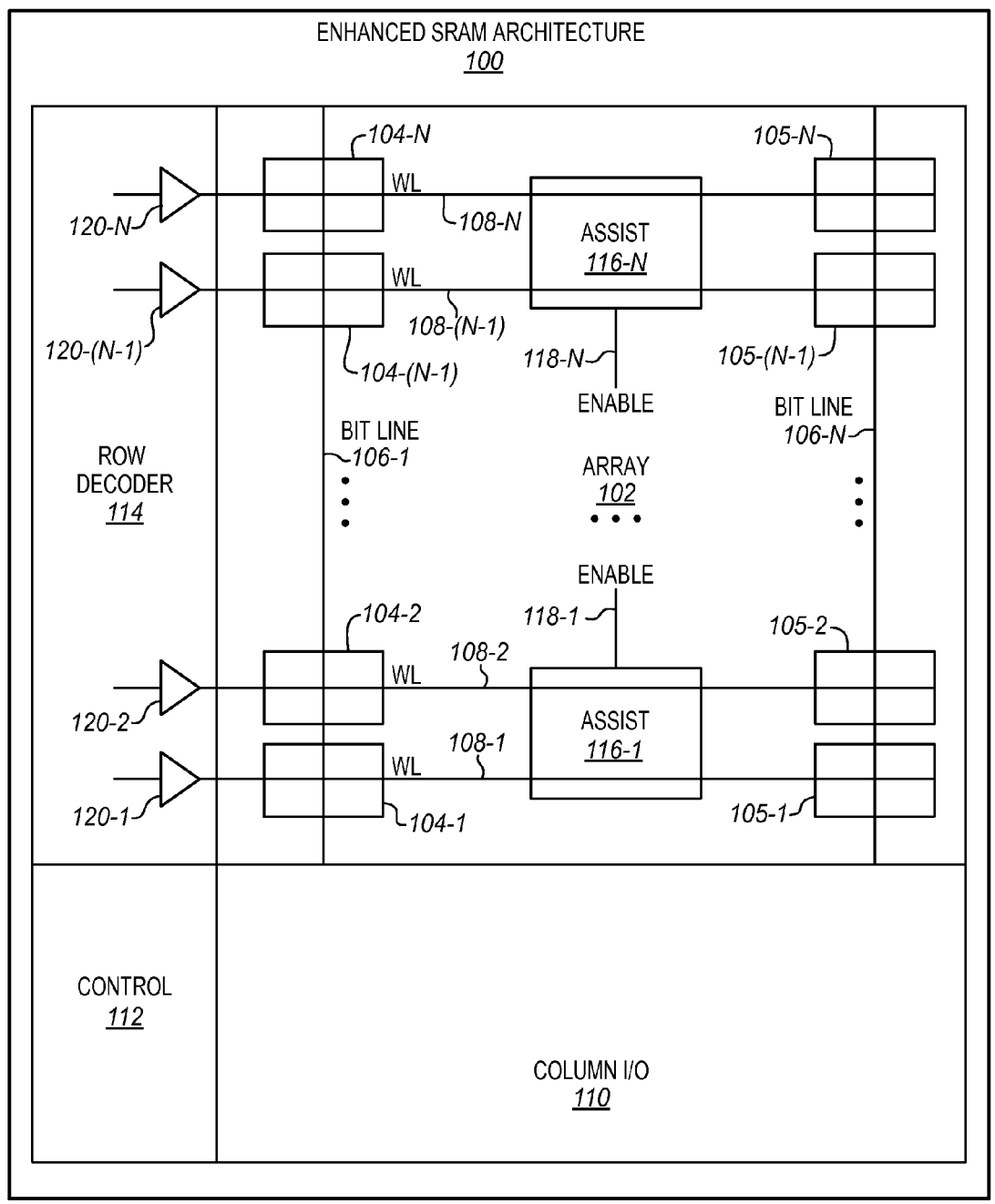
FIG. 1 is a block diagram of an exemplary SRAM architecture.

FIG. 1 is a block diagram of an exemplary SRAM architecture 100. Architecture 100 is a simplified block diagram view that will be used to discuss the inventive aspects of the SRAM devices disclosed herein. But, architecture 100 is not intended to limit the implementation to any particular embodiment. Those skilled in the art will understand that additional components not shown or described in FIG. 1, such as drivers, latches, decoders, sense amps, etc. may be used to implement architecture 100 in various configurations as a matter of design choice.

Architecture 100 in this embodiment includes an array 102 of memory cells 104-105. Memory cells 104-105 are disposed in array 102 at the intersections of column bit lines 106 and row word lines 108. For instance, memory cell 104-1 is disposed in array 102 where bit line 106-1 intersects word line 108-1. To access memory cell 104-1, word line 108-1 is asserted utilizing a driver 120-1 of a row decoder 114, and bit data stored at memory cell 104-1 is read out, or written by, bit line 106-1 utilizing circuits within column I/O 110. Bit lines 106 may be complimentary bit lines or single ended bit lines as a matter of design choice. Control 112 receives clock and address inputs and generates various control signals for architecture 100.

In this embodiment, a word line assist circuit 116 is located within array 102 to provide assist capabilities to word line drivers 120. Word line assist circuit 116 may be located about half way between word line drivers 120 and the far ends (e.g., near memory cells 105) of word lines 108 in some embodiments, although the particular location of word line assist circuit 116 along word lines 108 is a matter of design choice.

In architecture 100, word line assist circuit 116 provides additional drive capabilities for word lines 108, and works in combination with word line drivers 120 to allow word lines 108 to transition from a logical zero (or low) state to a logical one (or high) state more quickly. This allows data to be read from, or written to, memory cells 104-105 faster, thereby improving the performance of architecture 100. In the embodiments described herein, word line assist circuit 116 is not merely a re-buffer, which would introduce propagation delays along word lines 108, but rather is a circuit that does not introduce signaling delays along word lines 108, but still provides assist capabilities to word line drivers 120.

For instance, word line assist circuit 116-1 is coupled to word line 108-1 and word line 108-2, which are driven by word line driver 120-1 and word line driver 120-2, respectively. During operation, word line assist circuit 116 receives an enable signal 118-1, and provides an assist for word line driver 120-1 and word line driver 120-2 in transitioning their respective word lines 108 from a logical zero to a logical one based on a voltage differential between their respective word lines 108. For example, if word line driver 120-1 is transitioning word line 108-1 from a logical zero to a logical one, then a positive voltage differential between word line 108-1 and word line 108-2 (e.g., the voltage at word line 108-1 is higher than the voltage at word line 108-2) triggers word line assist circuit 116-1 to charge word line 108-1 to a logical one, thereby assisting word line driver 120-1 in transitioning word line 108-1 to a logical one more quickly. In like manner, if word line driver 120-2 is transitioning word line 108-2 from a logical zero to a logical one, then a positive voltage differential between word line 108-2 and word line 108-1 (e.g., the voltage at word line 108-2 is higher than the voltage at word line 108-1) triggers word line assist circuit 116-1 to charge word line 108-2 to a logical one, thereby assisting word line driver 120-2 in transitioning word line 108-2 to a logical one more quickly.

Enable 118 for word line circuits 116 may be generated based on the particular memory cells 104-105 being read from, or written to. For example, enable 118-1 may be generated based on address information or pre-decode signals for accessing memory cells 104-1 to 105-1 along word line 108-1, and/or memory cells 104-2 to 105-2 along word line 108-2. Sharing word line assist circuit 116-1 for word lines 108-1 and 108-2 reduces the die area impact of implementing word line assist circuit 116-1 in architecture 100. In contrast, re-buffers are typically implemented for each word line in a memory device, which utilizes a large amount of die area. Further, although word line assist circuit 116 is illustrated in FIG. 1 as coupled to pairs of word lines (e.g., word line assist circuit 116-1 is coupled to word line 108-1 and to word line 108-2), word line assist circuit 116 may be coupled to higher numbers of word lines 108 as a matter of design choice (e.g., coupled to 4 word lines, 8 word lines, etc.). This may also provide an additional saving of die area for implementing word line assist circuit 116 in architecture 100.

In this embodiment, word lines 108 toggle between logic levels defined by the memory cell supply of memory cells 104-105. Thus, part of the activity of word line assist circuit 116 is to assist word line drivers 118 in transitioning word lines 108 to a logical one state with sufficient voltage margin even at the far ends of word lines 108. This ensures that memory cells 104-105 that are located farthest from word line drivers 120 (e.g., memory cells 105) still operate correctly. The specifics of how word line assist circuit 116 may operate in will become more readily apparent in the following discussion.

Figure 2:
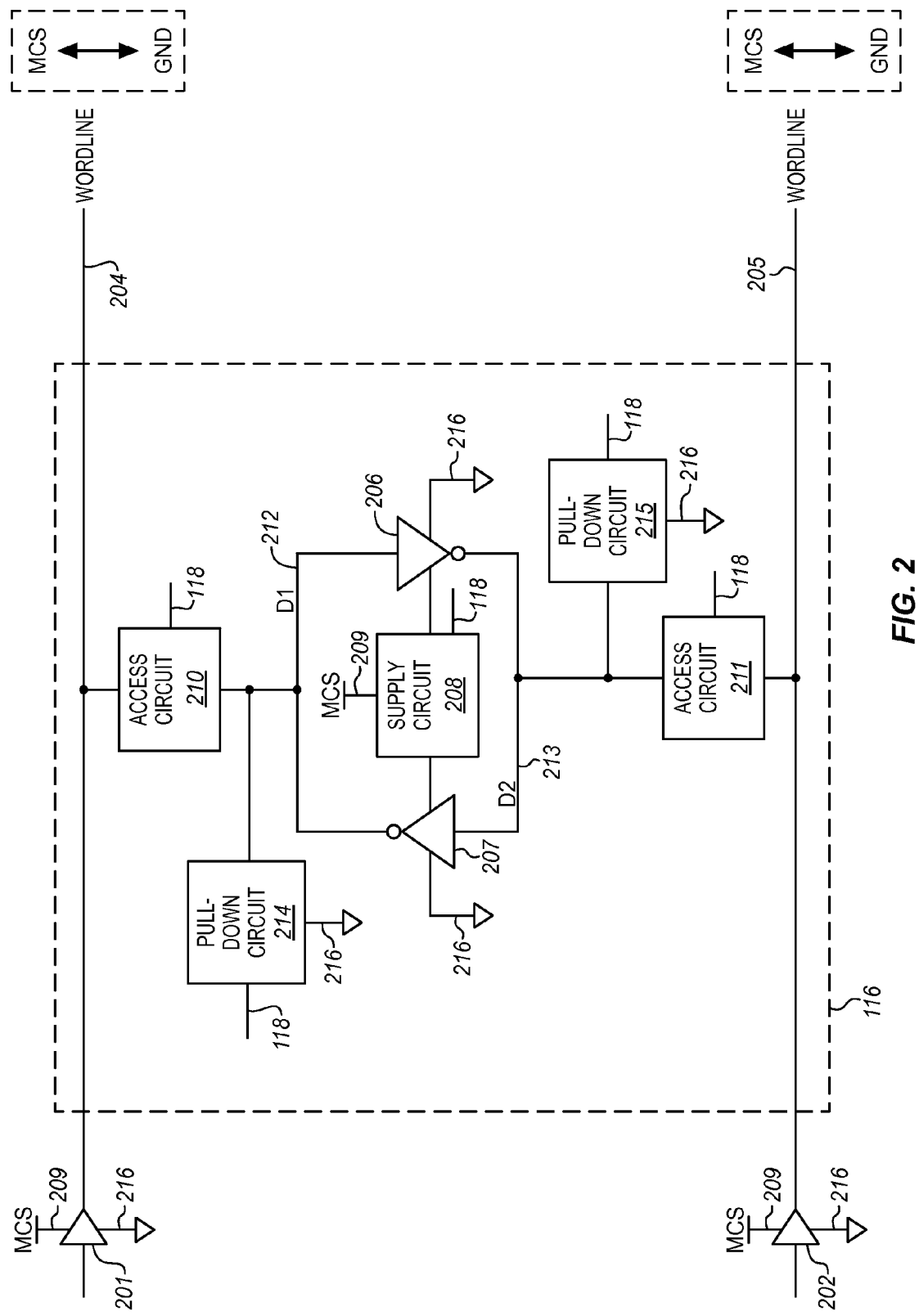
FIG. 2 is a block diagram of a word line assist circuit in an exemplary embodiment.

FIG. 2 is a block diagram of word line assist circuit 116 in an exemplary embodiment. In this embodiment, a pair of word line drivers 201-202 is coupled to word lines 204-205, and toggle word lines 204-205 between a logical zero defined by a memory cell supply 209 and a logical one defined by memory cell supply 209. For instance, when memory cell supply 209 is referenced to ground 216, then a logical zero for word lines 204-205 may be approximately a voltage of ground 218, while a logical one for word lines 204-205 may be approximately a voltage of memory cell supply 209. However, the particular voltages for a logic zero or a logic one in architecture 100 along with their associated low level or high level noise margins, is a matter of design choice.

FIG. 2 illustrates a pair of cross-coupled inverters 206-207 forming a latch circuit that is utilized to provide assist capabilities for word line drivers 201-202. Inverter 206 has a ground terminal coupled to ground 216 and a supply terminal coupled to a supply circuit 208. Inverter 206 has an output coupled to a node 213, and an input coupled to a node 212. Inverter 207 has a ground terminal coupled to ground 216 and a supply terminal coupled to supply circuit 208. Inverter 207 has an output coupled to node 212, and an input coupled to node 213. In this embodiment, inverters 206-207 comprise any component(s) or device(s) that are able to generate an output signal that is a compliment of an input signal.

Supply circuit 208 in FIG. 2 is coupled to memory cell supply 209 and powers inverters 206-207 based on enable 118. For instance, with enable 118 at a logical zero, supply circuit 208 couples memory cell supply 209 to inverters 206-207. With enable 118 at a logical one, supply circuit 208 decouples memory cell supply 209 from inverters 206-207. In some embodiments, the logic may be reversed. In this embodiment, supply circuit 208 comprises any component(s) or device(s) that are able to couple memory cell supply 209 to inverters 206-207 based on enable 118.

FIG. 2 further illustrates a pair of access circuits 210-211 that couple word lines 204-205 to nodes 212-213, respectively, based on enable 118. For example, with enable 118 at a logical zero, access circuit 210 couples word line 204 to node 212, and access circuit 211 couples word line 205 to node 213. With enable 118 at a logical one, access circuit 210 decouples word line 204 from node 212, and access circuit 211 decouples word line 205 from node 213. In some embodiments, the logic may be reversed. In this embodiment, access circuits 210-211 comprise any component(s) or device(s) that are able to couple word lines 204-205 to their respective nodes 212-213 based on enable 118.

Also illustrated in FIG. 2 is a pair of pull-down circuits 214-215. Pull-down circuit 214 is coupled to ground 216 and to node 212, and couples node 212 to ground 216 based on enable 118. Pull-down circuit 215 is coupled to ground 216 and to node 213, and couples node 213 to ground 216 based on enable 118. For instance, with enable 118 at a logical zero, pull-down circuit 214 decouples node 212 from ground 216, and pull-down circuit 215 decouples node 213 from ground 216. With enable 118 at a logical one, pull-down circuit 214 couples node 212 to ground 216 and pull-down circuit 215 couples node 213 to ground 216. In some embodiments, the logic may be reversed. In this embodiment, pull-down circuits 214-215 comprise any component(s) or device(s) that are able to couple their respective nodes 212-213 to ground 216 based on enable 118.

In this embodiment, assist capabilities are not provided to word line drivers 201-202 when enable 118 for word line assist circuit 116 is at a logical one, although in other embodiments the logic may be reversed. With enable 118 at a logical one, pull-down-circuits 214-215 couple both nodes 212-213 to ground 216. Supply circuit 208 decouples memory cell supply 209 from inverters 206-207, and access circuits 210-211 de-couple word lines 204-205 from their respective nodes 212-213. When enable 118 toggles to a logical zero, pull-down circuits 214-215 decouple nodes 212-213 from ground 216, and supply circuit 208 applies memory cell supply 209 to power inverters 206-207. Both access circuits 210-211 couple their respective word lines 204-205 to nodes 212-213. In this state, word line assist circuit 116 will provide assist capabilities to one or the other of word lines 204-205 depending on a voltage differential between word lines 204-

205. For instance, with word line 205 held at a logical zero and word line driver 201 driving word line 204 high, a voltage differential between word line 204 and word line 205 is applied to inverters 206-207. The voltage differential is sensed by inverters 206-207, and the output of inverter 207 sets node 212 at a logical one while the output of inverter 206 sets node 213 at a logical zero. With word line driver 201 driving word line 204 towards the voltage of memory cell supply 209, inverter 207 sources current through access circuit 210 to charge word line 204 in concert with word line driver 201, which improves the logical zero to logical one transition time for word line 204.

In the converse case, word line 204 is held at a logical zero and word line driver 202 drives word line 205 high. A voltage differential between word line 205 and word line 204 is applied to inverters 206-207. The voltage differential is sensed by inverters 206-207, and the output of inverter 206 sets node 213 at a logical one while the output of inverter 207 sets node 212 at a logical zero. With word line driver 202 driving word line 205 towards the voltage of memory cell supply 209, inverter 206 sources current through access circuit 211 to charge word line 205 in concert with word line driver 202, which improves the logical zero to logical one transition time for word line 205. Utilizing word line assist circuit 116, assist may be provided to either word line driver 201 or word line driver 202 depending on which of word lines 204-205 is transitioning to a logical one. Further, this assist capability is provided without introducing delays in the signaling path for either word line 204 or word line 205. Also, inverters 206-207 may be disabled (e.g., utilizing enable 118 to decouple memory cell supply 209 from inverters 206-207) when word line assist circuit 116 is not in use, which reduces the parasitic power for architecture 100.

Figure 3:
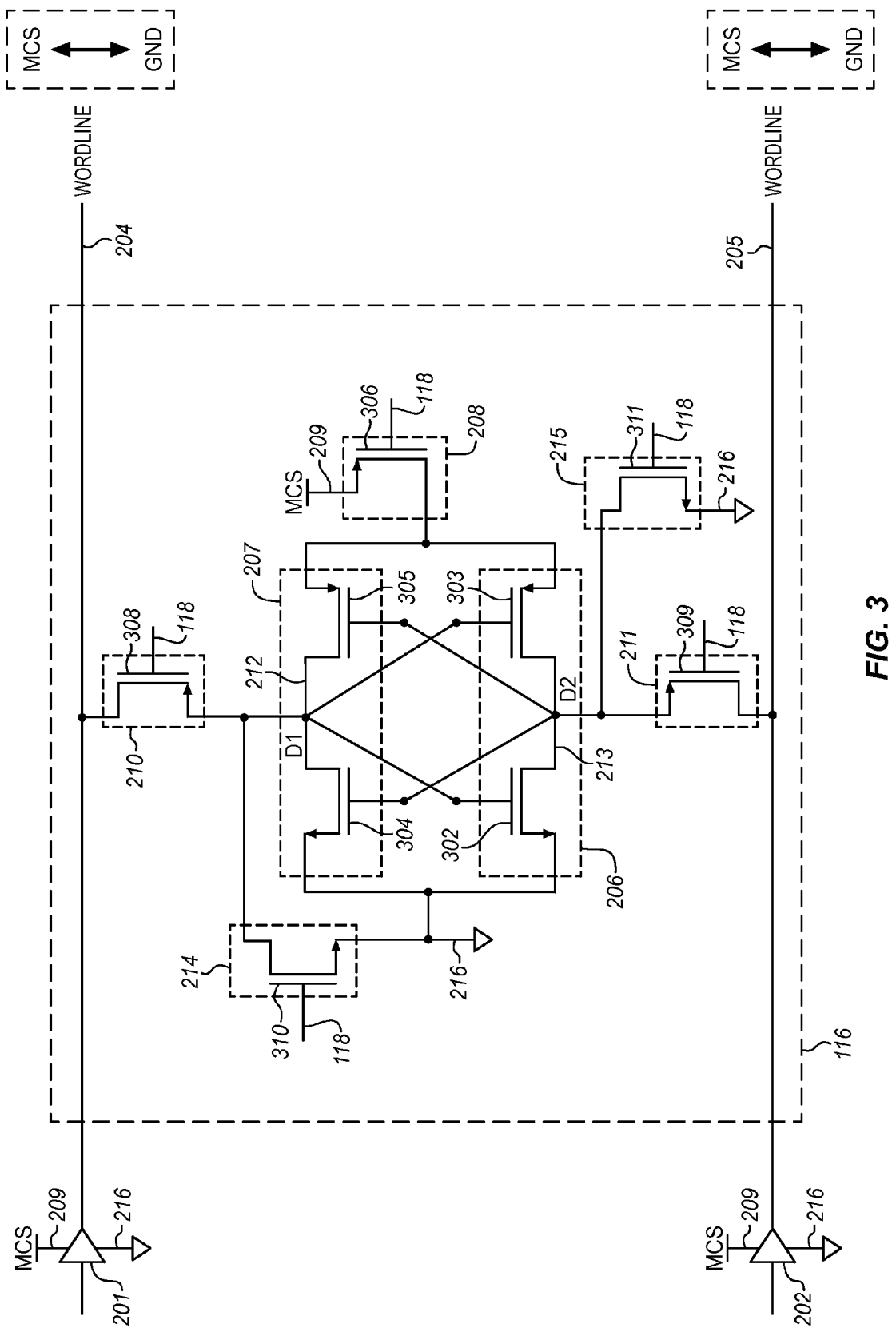
FIG. 3 is a schematic diagram of the word line assist circuit of FIG. 2 in an exemplary embodiment.

FIG. 3 is a schematic diagram of the word line assist circuit 116 of FIG. 2 in an exemplary embodiment. In this embodiment, a number of Field-Effect Transistors (FETs) 302-311 are illustrated in a particular configuration for implementing the functionality previously described for word line assist circuit 116 of FIG. 2. FETs 302-311 may include any type of field-effect transistor as a matter of design choice. One example of a FET is a Metal Oxide Semiconductor Field Effect Transistor (MOSFET). Although FIG. 3 illustrates one configuration of a number of FETs, one skilled in the art will understand other configurations may be implemented as a matter of design choice. Thus, it is not intended that word line assist circuit 116 be limited to only the configuration and types of components illustrated in FIG. 3. Further, for this embodiment P-channel FETs have a body or bulk connection to memory cell supply 209, and N-channel FETs have a body or bulk connection to ground 216, although other configurations may exist.

In this embodiment, inverter 206 is implemented utilizing an N-channel FET 302 and a P-channel FET 303. FET 302 of inverter 206 has a source terminal coupled to ground 216, a gate terminal coupled to node 212, and a drain terminal coupled to node 213. FET 303 of inverter 206 has a source terminal coupled to supply circuit 208, a gate terminal coupled to node 212, and a drain terminal coupled to node 213. Inverter 207 is implemented utilizing an N-channel FET 304 and a P-channel FET 305. FET 304 of inverter 207 has a source terminal coupled to ground 216, a gate terminal coupled to node 213, and a drain terminal coupled to node 212. FET 305 of inverter 207 has a source terminal coupled to supply circuit 208, a gate terminal coupled to node 213, and a drain terminal coupled to node 212. Due to the cross-coupling of inverters 206-207, node 212 is the output of inverter 207 and the input to inverter 206. In like manner, node 213 is the output of inverter 206 and the input to inverter 207.

Supply circuit 208 in this embodiment is implemented utilizing a P-channel FET 306, which has a source terminal coupled to memory cell supply 209, a gate terminal coupled to enable 118, and a drain terminal coupled to the source terminals of FET 303 and FET 305. If enable 118 is at a logical zero, then FET 306 is on, which couples memory cell supply 209 to the source terminals of FET 303 and FET 305. If enable 118 is at a logical one, then FET 306 is off, which decouples memory cell supply 209 from the source terminals of FET 303 and FET 305.

Access circuits 210-211 in this embodiment are implemented utilizing P-channel FET 308 and P-channel FET 309, respectively. FET 308 has a source terminal coupled to node 212, a gate terminal coupled to enable 118, and a drain terminal coupled to word line 204. FET 309 has a source terminal coupled to node 213, a gate terminal coupled to enable 118, and a drain terminal coupled to word line 205. If enable 118 is at a logical zero, then FETs 308-309 are on, which couples word line 204 to node 212 and word line 205 to node 213. If enable 118 is at a logical one, then FETs 308-309 are off, which decouples word line 204 from node 212 and word line 205 from node 213.

Pull-down circuits 214-215 in this embodiment are implemented utilizing N-channel FET 310 and N-channel FET 311, respectively. FET 310 has a drain terminal coupled to node 212, a gate terminal coupled to enable 118, and a source terminal coupled to ground 216. FET 311 has a drain terminal coupled to node 213, a gate terminal coupled to enable 118, and a source terminal coupled to ground 216. If enable 118 is at a logical zero, then both FET 310 and FET 311 are off, which decouples nodes 212-213 from ground 216. If enable 118 is at a logical one, then FETs 310-311 are on, which couples nodes 212-213 to ground 216.

In this embodiment, assist capabilities are not provided to word line drivers 201-202 when enable 118 for word line assist circuit 116 is at a logical one, although in other embodiments the logic may be reversed. With enable 118 at a logical one, FETs 310-311 of pull-down circuits 214-215 are on, which couples nodes 212-213 to ground 216. FET 306 of supply circuit 208 is off, which decouples memory cell supply 209 from FET 303 of inverter 206 and FET 305 of inverter 207. FETs 308-309 of access circuits 210-211 are off, which decouple word lines 204-205 from their respective nodes 212-213.

When enable 118 toggles to a logical zero, FETs 310-311 of pull-down circuits 214-215 turn off, which decouples nodes 212-213 from ground 216. FET 306 of supply circuit 218 turns on, which couples memory cell supply 209 to FET 303 and FET 305 of inverters 206-207. FETs 308-309 of access circuits 210-211 are on, which couple their respective word lines 204-205 to nodes 212-213. In this state, word line assist circuit 116 will provide assist capabilities to one or the other of word lines 204-205 depending on a voltage differential between word lines 204-205. Initially, nodes 212-213 start around the voltage of ground 216, due to being previously discharged by FETs 310-311. FET 303 and FET 305 are on, which charges nodes 212-213 towards the turn-off voltage for FET 303 and FET 305. FET 302 and FET 304 may be weakly on.

With word line 205 held at a logical zero and word line driver 201 driving word line 204 high, FET 309 is unable to pull node 213 below the turn-on voltage for FET 303. Node 212 follows the voltage of word line 204, which eventually rises to turn off FET 303. FET 302 turns on strongly, which discharges node 213. This turns off FET 304 and turns FET 305 on strongly, latching node 212 at the voltage of memory cell supply 209 and latching node 213 at the voltage of ground 216. Memory cell supply 209 then sources current through FET 306, FET 305, and FET 308 to charge word line 204, thereby providing assist to word line driver 201.

In the converse case, word line 204 is held at a logical zero and word line driver 202 is driving word line 205 high. Initially, nodes 212-213 start around the voltage of ground 216, due to being previously discharged by FETs 310-311. FET 303 and FET 305 are on, which charges nodes 212-213 towards the turn-off voltage for FET 303 and FET 305. FET 302 and FET 304 may be weakly on. FET 308 is unable to pull node 212 below the turn-on voltage for FET 305. Node 213 follows the voltage of word line 205, which eventually rises to turn off FET 305. FET 304 turns on strongly, which discharges node 212. This turns off FET 302 and turns on FET 303 strongly, latching node 213 at the voltage of memory cell supply 209 and latching node 212 at the voltage of ground 216. Memory cell supply 209 then sources current through FET 306, FET 303, and FET 309 to charge word line 205, thereby providing assist to word line driver 202.

Utilizing word line assist circuit 116 of FIG. 3, assist may be provided to either word line driver 201 or word line driver 202 depending on which of word lines 204-205 is transitioning to a logical one. Further, this assist capability is provided without introducing delays in the signaling path for either word line 204 or word line 205. Also, FET 302 and FET 305 may be decoupled from memory cell supply 209 when word line assist circuit 116 is not in use, which reduces the parasitic power for architecture 100 by reducing the leakage path from memory cell supply 209 to ground 216.

Although FIG. 3 illustrates that word line assist circuit 116 may be used to provide assist for a pair of word lines 204-205, other embodiments may provide assist to 4 or more word lines by scaling the circuit illustrated in FIG. 3 and using additional enable signals. For example, to provide assist for four word lines, two enable signals may be used. Both enable signals may be AND-ed together in pull-down circuits 214-215 (e.g., by utilizing a series configuration of N-channel FETs). Four access circuits can be used to couple the four word lines to nodes 212-213 (e.g., using P-channel FETs in a configuration similar to FETs 308-309 for the word lines, with one pair of assist circuits sharing one enable signal, and another pair of assist circuits sharing another enable signal). Further, both enable signals may be OR-ed together in supply circuit 208 (e.g., by utilizing a parallel configuration of P-channel FETs). This scaling provides additional word line assist capabilities to additional word line pairs with minimal additional die area impact for architecture 100.

Figure 4:
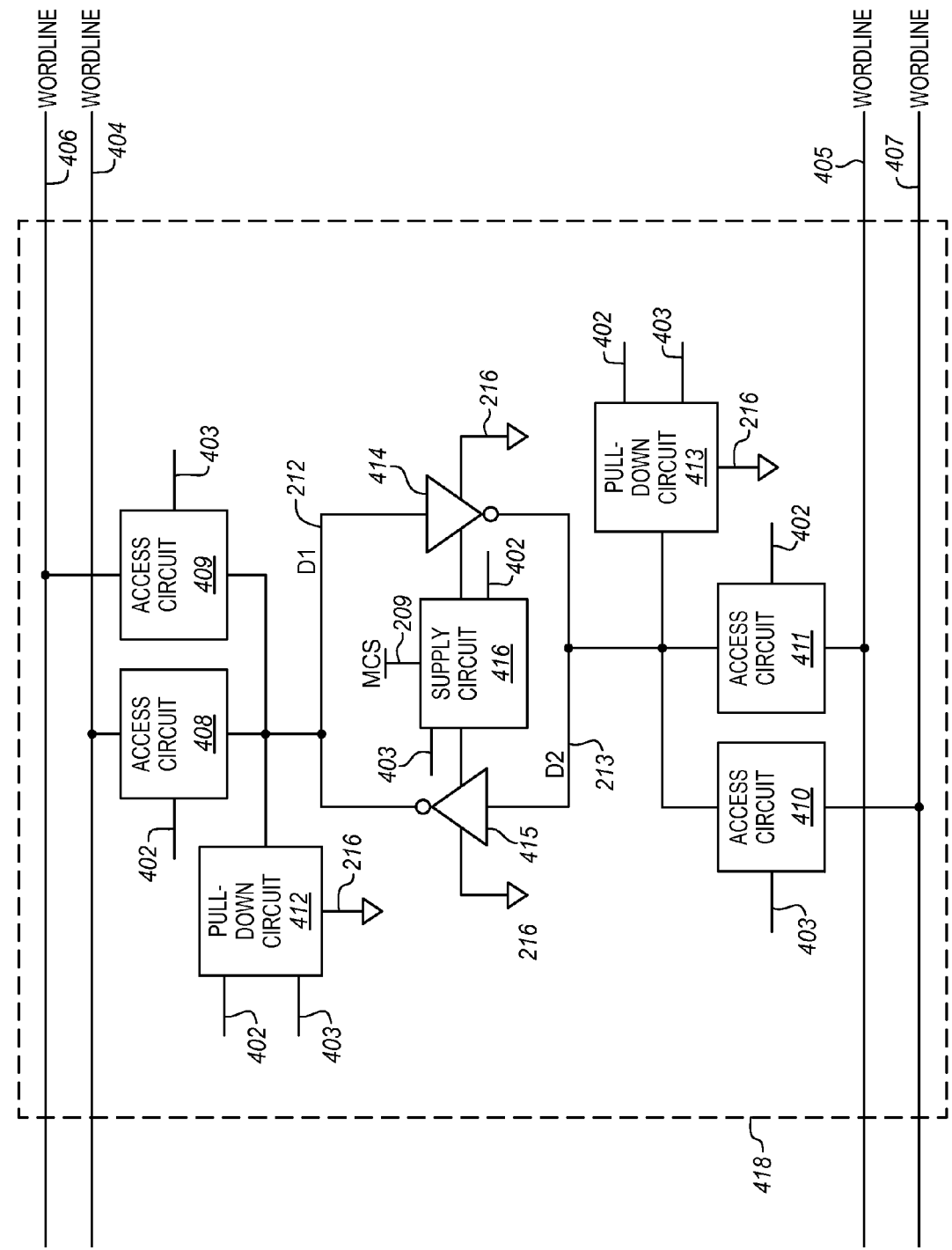
FIG. 4 is a block diagram of a word line assist circuit for two pairs of word lines in an exemplary embodiment.

FIG. 4 is a block diagram of a word line assist circuit for two pairs of word lines in an exemplary embodiment. In this embodiment, a word line assist circuit 418 is able to provide assist to word lines 404-407 based on enable 402 and enable 403. When both enable 402 and enable 403 are a logical one, pull-down circuit 412 couples node 212 to ground 216, and pull-down circuit 413 couples node 213 to ground 216. Supply circuit 416 decouples memory cell supply 209 from a pair of cross-coupled inverters 414-415, and access circuits 408-411 decouple word lines 404-406 from their respective nodes 212-213. In some embodiments, the logic may be reversed. If either of enable 402 or enable 403 toggles to a logical one, pull-down circuits 412-413 decouple their respective nodes 212-213 from ground 216, and supply circuit 416 applies memory cell supply 209 to power inverters 414-415. Access circuits 408-411 couple their respective word lines 404-407 to their respective nodes 212-213 based on enable 402 and enable 403. For instance, if enable 402 toggles to a logical zero, access circuit 411 couples word line 405 to node 213, and access circuit 408 couples word line 404 to node 212. Word line assist circuit 418 may then operate similar to word line assist circuit 116 of FIGS. 1-3 to provide assist to the word line drivers for word lines 404-405. If enable 403 toggles to a logical zero, access circuit 410 couples word line 407 to node 213, and access circuit 409 couples word line 406 to node 212. Word line assist circuit 418 may then operate similar to word line assist circuit 116 of FIGS. 1-3 to provide assist to the word line drivers for word lines 406-407.

What is claimed is:

1. A Static Random Access Memory (SRAM) device, comprising:
    a memory cell array;
    a pair of word lines traversing the memory cell array for selecting memory cells of the memory cell array, wherein each of the word lines has a first end and a second end;
    a pair of word line drivers coupled to the first end of the word lines, wherein a first of the word line drivers is operable to toggle a first of the word lines between logic levels defined by a memory cell supply for the memory cells, wherein a second of the word line drivers is operable to toggle a second of the word lines between the logic levels; and
    a word line assist circuit coupled to the pair of word lines and operable to receive an enable signal, and responsive to receiving the enable signal, the word line assist circuit is further operable to:
        assist the first word line driver in transitioning the first word line from a logic level zero to a logic level one in response to a positive voltage differential between the first word line and the second word line; and
        assist the second word line driver in transitioning the second word line from a logic level zero to a logic level one responsive to a positive voltage differential between the second word line and the first word line.

2. The SRAM device of claim 1 wherein the word line assist circuit comprises:
    a first inverter of a pair of cross-coupled inverters having an output coupled to a first node and an input coupled to a second node;
    a second inverter of the pair of cross-coupled inverters having an output coupled to the second node and an input coupled to the first node;
    a supply circuit operable to apply the memory cell supply to power the first inverter and the second inverter based on the enable signal;
    a first access circuit operable to couple the first word line to the first node based on the enable signal;
    a second access circuit operable to couple the second word line to the second node based on the enable signal;
    a first pull-down circuit operable to couple the first node to ground based on the enable signal; and
    a second pull-down circuit operable to couple the second node to the ground based on the enable signal.

3. The SRAM device of claim 2 wherein the supply circuit comprises:
    a P-channel Field Effect Transistor having a source terminal coupled to the memory cell supply, a gate terminal coupled to the enable signal, and a drain terminal coupled to a power input of the first inverter and the second inverter.

4. The SRAM device of claim 2 wherein the first access circuit comprises:

a P-channel Field Effect Transistor having a source terminal coupled to the first node, a gate terminal coupled to the enable signal, and a drain terminal coupled to the first word line.

5. The SRAM device of claim 2 wherein the second access circuit comprises:
a P-channel Field Effect Transistor having a source terminal coupled to the second node, a gate terminal coupled to the enable signal, and a drain terminal coupled to the second word line.

6. The SRAM device of claim 2 wherein the first pull-down circuit comprises:
an N-channel Field Effect Transistor having a drain terminal coupled to the first node, a gate terminal coupled to the enable signal, and a source terminal coupled to the ground.

7. The SRAM device of claim 2 wherein the second pull-down circuit comprises:
an N-channel Field Effect Transistor having a drain terminal coupled to the second node, a gate terminal coupled to the enable signal, and a source terminal coupled to the ground.

8. The SRAM device of claim 2 wherein the first inverter comprises:
a P-channel Field Effect Transistor (FET) having a source terminal coupled to the supply circuit, a gate terminal coupled to the second node, and a drain terminal coupled to the first node; and
an N-channel FET having a drain terminal coupled to the first node, a gate terminal coupled to the second node, and a source terminal coupled to the ground.

9. The SRAM device of claim 2 wherein the second inverter comprises:
a P-channel Field Effect Transistor (FET) having a source terminal coupled to the supply circuit, a gate terminal coupled to the first node, and a drain terminal coupled to the second node; and
an N-channel FET having a drain terminal coupled to the second node, a gate terminal coupled to the first node, and a source terminal coupled to the ground.

10. The SRAM device of claim 1 wherein:
the word line assist circuit is disposed approximately half way between the first end of the word lines and the second end of the word lines.

11. A Static Random Access Memory (SRAM) device, comprising:
a memory cell array;
a pair of word lines traversing the memory cell array for selecting memory cells of the memory cell array, wherein each of the word lines has a first end and a second end;
a pair of word line drivers coupled to the first end of the word lines, wherein a first of the word line drivers is operable to toggle a first of the word lines between logic levels defined by a memory cell supply for the memory cells, wherein a second of the word line drivers is operable to toggle a second of the word lines between the logic levels; and
a word line assist circuit coupled to the pair of word lines, the word line assist circuit comprising:
a first inverter of a pair of cross-coupled inverters having an output coupled to a first node and an input coupled to a second node;
a second inverter of the pair of cross-coupled inverters having an output coupled to the second node and an input coupled to the first node;
a supply circuit operable to apply the memory cell supply to power the first inverter and the second inverter based on the enable signal;
a first access circuit operable to couple the first word line to the first node based on the enable signal;
a second access circuit operable to couple the second word line to the second node based on the enable signal;
a first pull-down circuit operable to couple the first node to ground based on the enable signal; and
a second pull-down circuit operable to couple the second node to the ground based on the enable signal.

12. The SRAM device of claim 11 wherein the supply circuit comprises:
a P-channel Field Effect Transistor having a source terminal coupled to the memory cell supply, a gate terminal coupled to the enable signal, and a drain terminal coupled to a power input of the first inverter and the second inverter.

13. The SRAM device of claim 11 wherein the first access circuit comprises:
a P-channel Field Effect Transistor having a source terminal coupled to the first node, a gate terminal coupled to the enable signal, and a drain terminal coupled to the first word line.

14. The SRAM device of claim 11 wherein the second access circuit comprises:
a P-channel Field Effect Transistor having a source terminal coupled to the second node, a gate terminal coupled to the enable signal, and a drain terminal coupled to the second word line.

15. The SRAM device of claim 11 wherein the first pull-down circuit comprises:
an N-channel Field Effect Transistor having a drain terminal coupled to the first node, a gate terminal coupled to the enable signal, and a source terminal coupled to the ground.

16. The SRAM device of claim 11 wherein the second pull-down circuit comprises:
an N-channel Field Effect Transistor having a drain terminal coupled to the second node, a gate terminal coupled to the enable signal, and a source terminal coupled to the ground.

17. The SRAM device of claim 11 wherein the first inverter comprises:
a P-channel Field Effect Transistor (FET) having a source terminal coupled to the supply circuit, a gate terminal coupled to the second node, and a drain terminal coupled to the first node; and
an N-channel FET having a drain terminal coupled to the first node, a gate terminal coupled to the second node, and a source terminal coupled to the ground.

18. The SRAM device of claim 11 wherein the second inverter comprises:
a P-channel Field Effect Transistor (FET) having a source terminal coupled to the supply circuit, a gate terminal coupled to the first node, and a drain terminal coupled to the second node; and
an N-channel FET having a drain terminal coupled to the second node, a gate terminal coupled to the first node, and a source terminal coupled to the ground.

19. The SRAM device of claim 11 wherein:
the word line assist circuit is disposed approximately half way between the first end of the word lines and the second end of the word lines.

20. A Static Random Access Memory (SRAM) device, comprising:

a memory cell array;

a pair of word lines traversing the memory cell array for selecting memory cells of the memory cell array, wherein each of the word lines has a first end and a second end;

a pair of word line drivers coupled to the first end of the word lines, wherein a first of the word line drivers is operable to toggle a first of the word lines between logic levels defined by a memory cell supply for the memory cells, wherein a second of the word line drivers is operable to toggle a second of the word lines between the logic levels; and a word line assist circuit coupled to the pair of word lines and configured to receive an enable signal, the word line assist circuit comprising:

- a first P-channel Field Effect Transistor (FET) having a source terminal, a gate terminal coupled to a second node, and a drain terminal coupled to a first node;
- a second N-channel FET having a drain terminal coupled to the first node, a gate terminal coupled to the second node, and a source terminal coupled to ground;
- a third P-channel FET having a source terminal, a gate terminal coupled to the first node, and a drain terminal coupled to the second node;
- a fourth N-channel FET having a drain terminal coupled to the second node, a gate terminal coupled to the first node, and a source terminal coupled to the ground;
- a fifth P-channel FET having a source terminal coupled to the memory cell supply, a gate terminal coupled to the enable signal, and a drain terminal coupled to the source terminal of the first FET and the source terminal of the third FET;
- a sixth P-channel FET having a source terminal coupled to the first node, a gate terminal coupled to the enable signal, and a drain terminal coupled to the first word line;
- a seventh P-channel FET having a source terminal coupled to the second node, a gate terminal coupled to the enable signal, and a drain terminal coupled to the second word line;
- an eighth N-channel FET having a drain terminal coupled to the first node, a gate terminal coupled to the enable signal, and a source terminal coupled to the ground; and
- a ninth N-channel FET having a drain terminal coupled to the second node, a gate terminal coupled to the enable signal, and a source terminal coupled to the ground.

* * * * *